United States Patent
Kawano et al.

(10) Patent No.: US 12,183,572 B2
(45) Date of Patent: Dec. 31, 2024

(54) FILM FORMATION METHOD AND FILM FORMATION DEVICE

(71) Applicant: TOKYO ELECTRON LIMITED, Tokyo (JP)

(72) Inventors: Yumiko Kawano, Yamanashi (JP); Shuji Azumo, Yamanashi (JP); Shinichi Ike, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 587 days.

(21) Appl. No.: 17/598,175

(22) PCT Filed: Mar. 12, 2020

(86) PCT No.: PCT/JP2020/010854
§ 371 (c)(1),
(2) Date: Sep. 24, 2021

(87) PCT Pub. No.: WO2020/195903
PCT Pub. Date: Oct. 1, 2020

(65) Prior Publication Data
US 2022/0181144 A1    Jun. 9, 2022

(30) Foreign Application Priority Data
Mar. 25, 2019  (JP) ................ 2019-057164

(51) Int. Cl.
*H01L 21/02* (2006.01)
*C23C 16/455* (2006.01)

(52) U.S. Cl.
CPC .... *H01L 21/0228* (2013.01); *C23C 16/45544* (2013.01); *H01L 21/0215* (2013.01); *H01L 21/02153* (2013.01)

(58) Field of Classification Search
None
See application file for complete search history.

(56) References Cited

U.S. PATENT DOCUMENTS

| 9,147,780 B2 | 9/2015 | Valckx et al. |
| 10,714,385 B2 | 7/2020 | Kovalgin et al. |

(Continued)

FOREIGN PATENT DOCUMENTS

| JP | H11-097434 A | 4/1999 |
| JP | 2007-501902 A | 2/2007 |

(Continued)

OTHER PUBLICATIONS

PCT International Search Report and Written Opinion, PCT Application No. PCT/JP2020/010854, Jun. 2, 2020, 8 pages (with English translation of PCT International Search Report).

*Primary Examiner* — Shaun M Campbell
*Assistant Examiner* — Carnell Hunter, III
(74) *Attorney, Agent, or Firm* — Fenwick & West LLP (57) ABSTRACT

There is provided a film formation method. The method comprises: preparing a substrate having a first region on which an oxide formed by oxidization of a surface of a conductive material is exposed and a second region on which an insulating material is exposed; replacing a film of the oxide with a film of boron oxide by supplying a boron halide gas to the substrate; etching the boron oxide film in the first region and forming a self-assembled monolayer film in the second region by supplying a gas of a fluorine-containing silane compound to the substrate; and forming a conductive target film selectively in the first region, from the first region and the second region, using the self-assembled monolayer film formed in the second region, the first region having the conductive material exposed thereon.

7 Claims, 5 Drawing Sheets

(56) References Cited

U.S. PATENT DOCUMENTS

| | | |
|---|---|---|
| 2006/0060562 A1 | 3/2006 | Furukawa et al. |
| 2015/0171241 A1 | 6/2015 | Valckx et al. |
| 2017/0062210 A1* | 3/2017 | Visser ............... H01L 21/02068 |
| 2018/0025939 A1 | 1/2018 | Kovalgin et al. |
| 2018/0053659 A1* | 2/2018 | Chakraborty ..... H01L 21/02636 |
| 2019/0148144 A1* | 5/2019 | Liu ......................... C23C 16/00 |
| | | 257/632 |
| 2019/0198318 A1* | 6/2019 | Bhuyan ................. H01L 21/321 |
| 2019/0316256 A1* | 10/2019 | Bhuyan ................... C23C 16/04 |
| 2020/0343134 A1 | 10/2020 | Kovalgin et al. |

FOREIGN PATENT DOCUMENTS

| | | |
|---|---|---|
| JP | 2018-059182 A | 4/2018 |
| WO | WO 2004/102648 A2 | 11/2004 |
| WO | WO 2014/097829 A1 | 6/2014 |

* cited by examiner

FILM FORMATION METHOD AND FILM FORMATION DEVICE

TECHNICAL FIELD

The present disclosure relates to a film formation method and a film formation device.

BACKGROUND

Patent Document 1 discloses a technique for selectively forming a target film in a specific region of a substrate without using a photolithography technique. Specifically, a technique for forming a self-assembled monolayer (SAM) that inhibits the formation of the target film in a certain region of the substrate and forming the target film in the remaining region of the substrate is disclosed.

Patent Document 1: Japanese Patent Application Publication No. 2007-501902

SUMMARY

One aspect of the present disclosure provides a technique capable of selectively forming a SAM in a second region, selected from a first region on which an oxide formed by oxidization of a surface of a conductive material is exposed and the second region on which an insulating material is exposed.

A film formation method according to one aspect of the present disclosure comprises preparing a substrate having a first region on which an oxide formed by oxidization of a surface of a conductive material is exposed and a second region on which an insulating material is exposed, replacing a film of the oxide with a film of boron oxide by supplying a boron halide gas to the substrate, etching the boron oxide film in the first region and forming a self-assembled monolayer film in the second region by supplying a gas of a fluorine-containing silane compound to the substrate, and forming a conductive target film selectively in the first region, from the first region and the second region, using the self-assembled monolayer film formed in the second region, the first region having the conductive material exposed thereon.

Effect of the Invention

In accordance with one aspect of the present disclosure, the SAM can be selectively formed in the second region, selected from the first region and the second region, wherein the first region has the insulating material exposed thereon and the first region has the oxide formed by the oxidization of the surface of the conductive material exposed thereon.

DETAILED DESCRIPTION

Hereinafter, embodiments of the present disclosure will be described with reference to the accompanying drawings. Further, like reference numerals will be given to like or corresponding parts, and redundant description thereof may be omitted.

Figure 1:
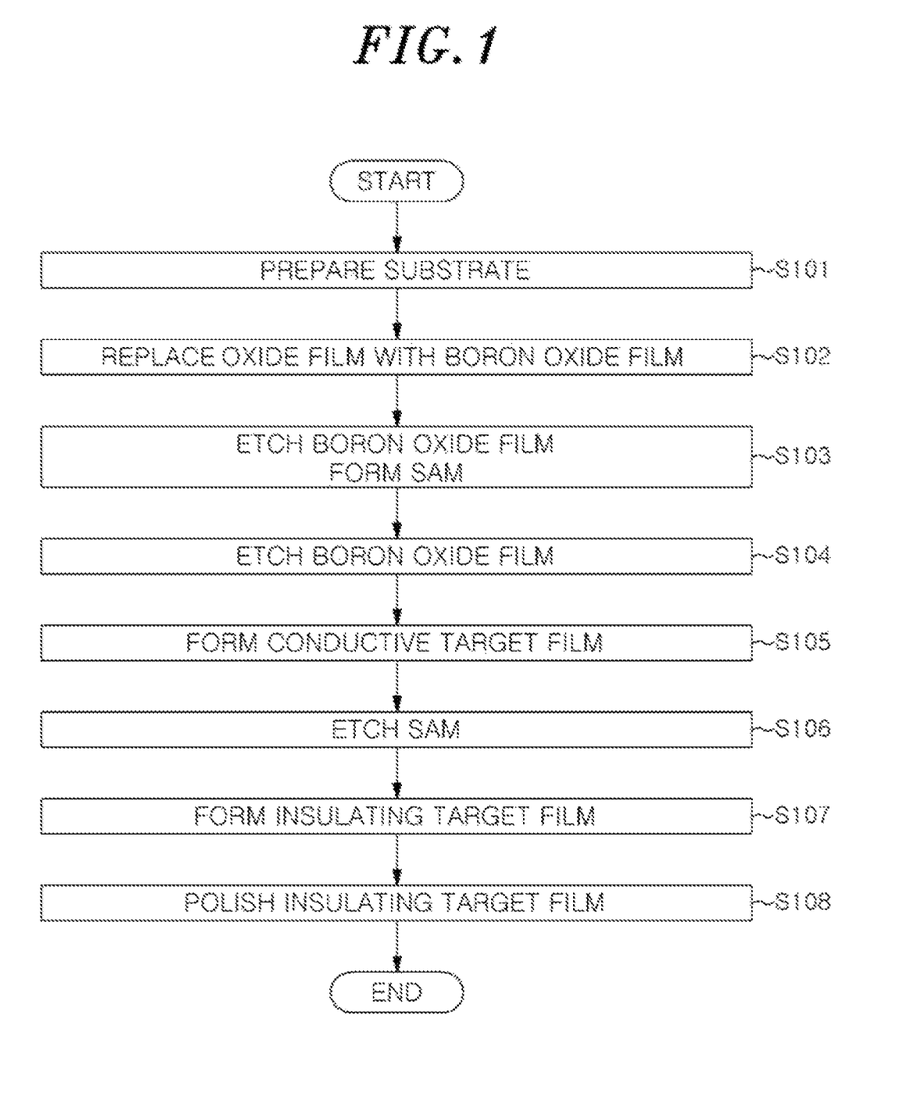
FIG. 1 is a flowchart showing a film formation method according to an embodiment.
Figure 2A:
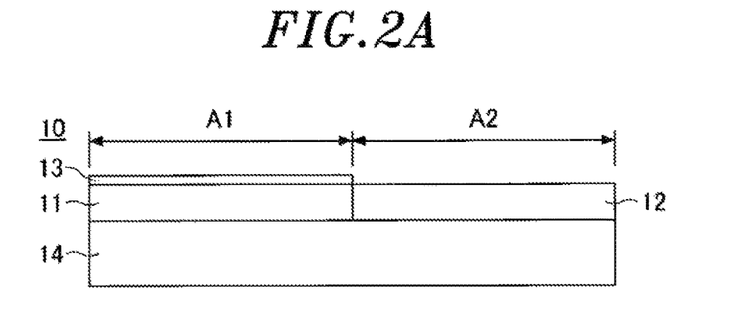
FIGS. 2A to 2D are side views showing examples of a state of a substrate in steps S101 to S104 shown in FIG. 1.
Figure 2B:
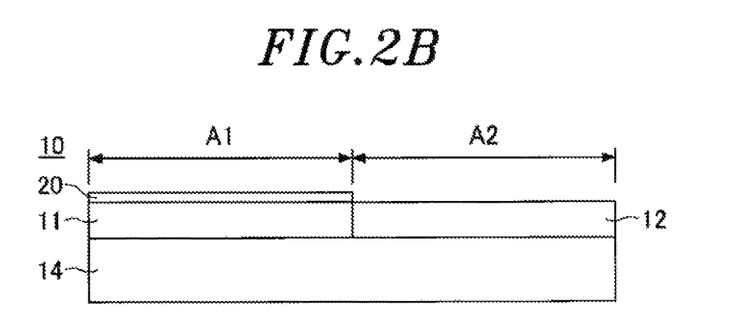
Figure 2C:
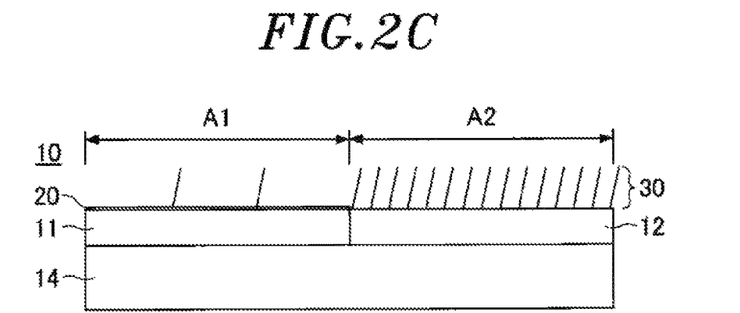
Figure 2D:
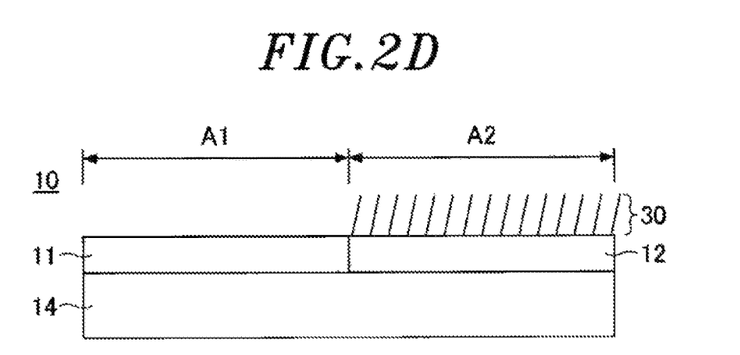
Figure 3A:
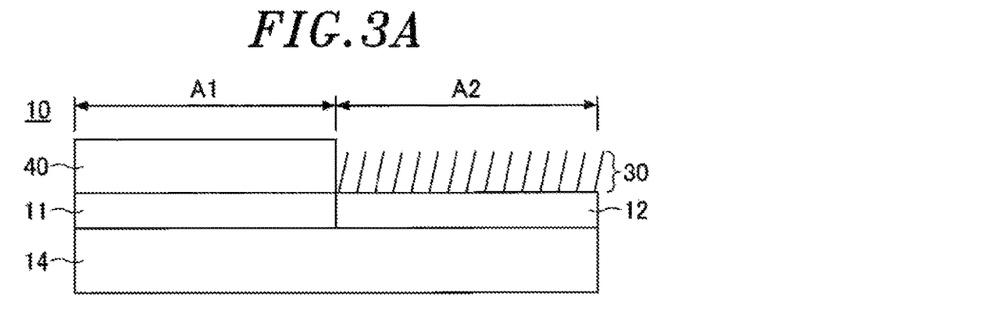
FIGS. 3A to 3D are side views showing examples of a state of the substrate in steps S105 to S108 shown in FIG. 1.
Figure 3B:
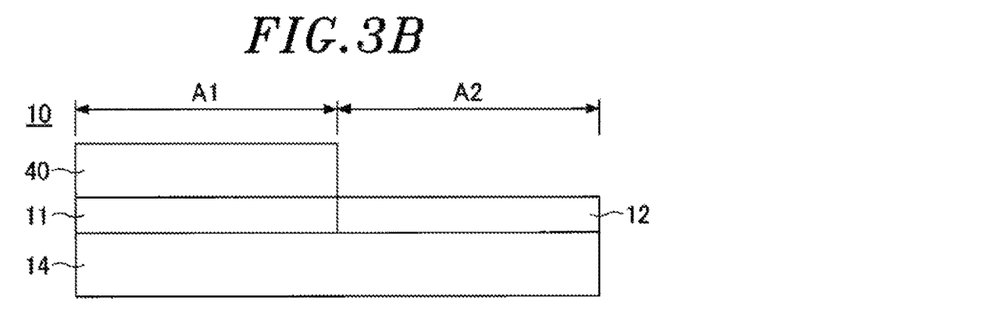
Figure 3C:
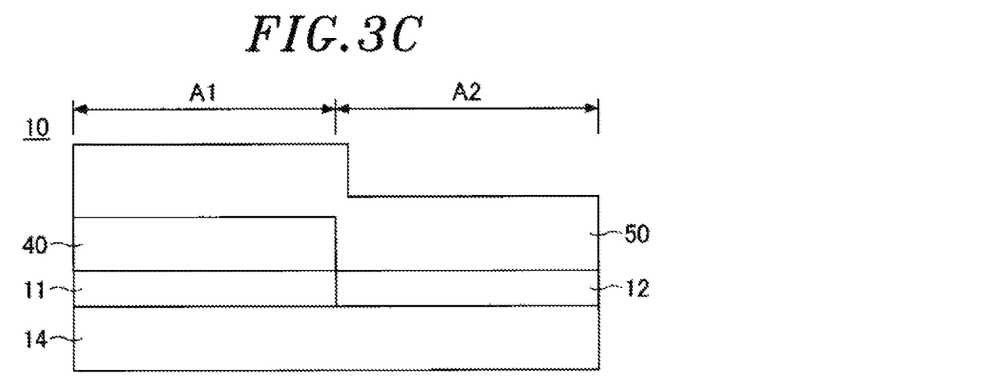
Figure 3D:
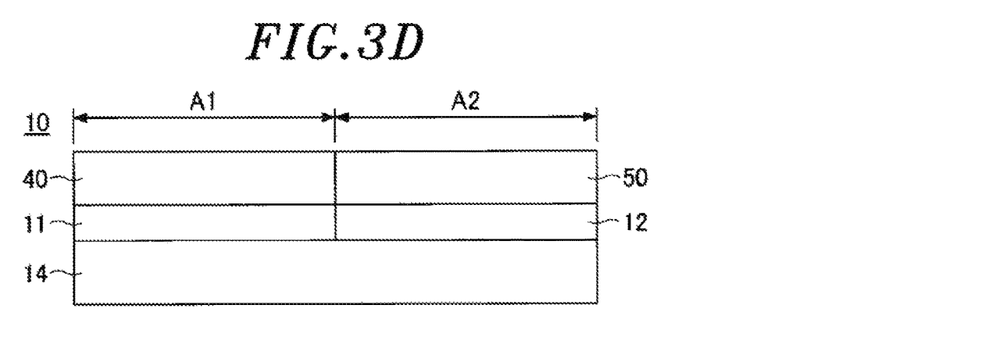

FIG. 1 is a flowchart showing a film formation method according to an embodiment. FIGS. 2A to 2D are side views showing examples of a state of a substrate in steps S101 to S104 shown in FIG. 1. FIG. 2A shows the state of the substrate prepared in step S101. FIG. 2B shows the state of the substrate obtained in step S102. FIG. 2C shows the state of the substrate obtained in step S103. FIG. 2D shows the state of the substrate obtained in step S104. FIGS. 3A to 3D are side views showing examples of a state of the substrate in steps S105 to S108 shown in FIG. 1. FIG. 3A shows the state of the substrate obtained in step S105. FIG. 3B shows the state of the substrate obtained in step S106. FIG. 3C shows the state of the substrate obtained in step S107. FIG. 3D shows the state of the substrate obtained in step S108.

The film formation method includes step S101 for preparing the substrate 10 as shown in FIG. 2A. The preparation includes, e.g., loading the substrate 10 into a processing container 120 (see FIG. 4) to be described later. The substrate 10 has a first region A1 on which a first material is exposed and a second region A2 on which a second material different from the first material is exposed. The first region A1 and the second region A2 are disposed on one side of the substrate 10 in a thickness direction of the substrate.

Although one first region A1 is illustrated in FIG. 2A, multiple first regions A1 may be provided. For example, two first regions A1 may be disposed with the second region A2 interposed therebetween. Similarly, although one second region A2 is illustrated in FIG. 2A, multiple second regions A2 may be provided. For example, two second regions A2 may be disposed with the first region A1 interposed therebetween.

Although only the first region A1 and the second region A2 are illustrated in FIG. 2A, a third region may be further provided. The third region is a region on which a third material different from the first material and the second material is exposed. The third region may be disposed between the first region A1 and the second region A2, or may be disposed outside the first region A1 and the second region A2.

The first material is, e.g., an oxide formed by oxidization of a surface of a conductive material. The conductive material is, e.g., tungsten (W), and an oxide of the conductive material is, e.g., tungsten oxide (WO). Although the conductive material is tungsten in the present embodiment, molybdenum (Mo), titanium (Ti), titanium nitride (TiN), tantalum (Ta), tantalum nitride (TaN), vanadium (V), vanadium nitride (VN), or the like may be used. The surfaces of these conductive materials are naturally oxidized over time in the atmosphere. The oxide thereof is the first material. The oxide that is the first material may be an oxynitride, and may be replaced with boron oxide in step S102 to be described later.

A tungsten oxide is also referred to as "WO" regardless of the composition ratio of oxygen and tungsten. A titanium nitride is also referred to as "TiN" regardless of the composition ratio of nitrogen and titanium. Similarly, a tantalum nitride is also referred to as "TaN" and a vanadium nitride is also referred to as "VN".

The second material is, e.g., an insulating material. The insulating material is, e.g., a silicon oxide. Hereinafter, a silicon oxide is also referred to as "SiO" regardless of the composition ratio of oxygen and silicon. Although the second material is a silicon oxide in the present embodiment, it may be a silicon nitride, a silicon oxynitride, a silicon carbide, an aluminum oxide, or the like. Unlike the first material, the second material may be a material that is hardly replaced with another material (e.g., boron oxide) in step S102 to be described later. In other words, in step S102 to be described later, the rate at which the second material is replaced with another material is slower than the rate at which the first material is replaced with boron oxide.

The substrate 10 has, e.g., a conductive film 11 made of the above-described conductive material and an insulating film 12 made of the above-described insulating material. On the surface of the conductive film 11, an oxide film 13 is naturally formed over time in the atmosphere. The conductive film 11 is, e.g., a tungsten film, and the oxide film 13 is, e.g., a tungsten oxide film.

The substrate 10 further has a base substrate 14 on which the conductive film 11 and the insulating film 12 are formed. The base substrate 14 is a semiconductor substrate such as a silicon wafer or the like. The base substrate 14 may be a glass substrate or the like.

The substrate 10 may further have a base film between the base substrate 14 and the conductive film 11, made of a material different from those of the base substrate 14 and the conductive film 11. Similarly, the substrate 10 may further have a base film between the base substrate 14 and the insulating film 12, made of a material different from those of the base substrate 14 and the insulating film 12.

The film formation method includes step S102 of replacing the oxide film 13 with a boron oxide film 20 by supplying a boron halide gas to the substrate 10 as shown in FIG. 2B. A metal halide and a boron oxide are produced by chemical reaction between the boron halide gas and the oxide film 13. Since the substrate 10 is heated to a predetermined temperature and the metal halide evaporates, the boron oxide film 20 is formed. The substrate 10 is heated to a temperature at which a vapor pressure of the metal halide is higher than that of the boron oxide and an evaporation rate of the metal halide is higher than that of boron oxide.

In the present embodiment, boron trichloride ($BCl_3$) gas is used as the boron halide gas. Due to the chemical reaction between $BCl_3$ gas and WO, $WCl_x$ and $B_2O_3$ are produced, for example. Since the substrate 10 is heated to the predetermined temperature and $WCl_x$ evaporates, a $B_2O_3$ film is formed.

The boron halide gas may be any gas containing boron and halogen, and is not limited to boron trichloride gas. For example, the boron halide gas may be boron trifluoride ($BF_3$) gas, boron triiodide ($BI_3$) gas, boron tribromide ($BBr_3$) gas, or the like.

The film formation method includes step S103 of etching the boron oxide film 20 in the first region A1 and forming a self-assembled monolayer (SAM) 30 in the second region A2 by supplying a gas of a fluorine-containing silane compound to the substrate 10 as shown in FIG. 2C. The SAM 30 is formed by chemical absorption of the silane compound in the second region A2, and inhibits the formation of a conductive target film 40 to be described later.

When the third region exists in addition to the first region A1 and the second region A2, the SAM 30 may or may not be formed in the third region.

The fluorine-containing silane compound is, e.g., a compound represented by a general formula R—$SiH_{3-x}Cl_x$ (x=1, 2, 3) or a compound represented by R'—$Si(O—R)_3$ (silane coupling agent). In this specification, R and R' are functional groups such as a group in which at least a part of hydrogen of an alkyl group is replaced with fluorine, or the like. The functional group has a CF-based terminal group. Further, O—R is a hydrolyzable functional group, e.g., a methoxy group or an ethoxy group. The fluorine-containing silane compound is not particularly limited, and is, e.g., $CF_3(CF_2)_xCH_2CH_2SiCl_3$, $CF_3(CF_2)_xCH_2CH_2Si(OMe)_3$, $CF_3(CF_2)_xCH_2CH_2Si(OEt)_3$, or the like. In this specification, X is an integer greater than or equal to 0 and smaller than or equal to 7.

Since the silane compound contains fluorine, the boron oxide film 20 can be etched. In the first region A1, the formation of the SAM 30 and the etching of the boron oxide film 20 proceed at the same time, so that the formation of the SAM 30 can be suppressed. The SAM 30 is hardly formed in the first region A1 compared to the second region A2. In the first region A1, the density of the SAM 30 is low, so that a gas can chemically react with the boron oxide film 20 while avoiding the SAM 30 in step S104 to be described later. Due to this chemical reaction, the boron oxide film 20 can be removed and the conductive film 11 can be exposed.

When the boron oxide film 20 is thin and the conductive film 11 that is a metal film is exposed until the end of step S103, step S104 to be described later is unnecessary. The silane compound is chemically adsorbed on the surface having an OH group, and thus is more easily chemically adsorbed on a metal compound than on a metal. Therefore, when the conductive film 11 is a metal film, the silane compound is selectively chemically adsorbed on the second region A2, among the first region A1 and the second region A2, after the conductive film 11 is exposed.

As described above, the film formation method includes replacement of the oxide film 13 with the boron oxide film 20 (step S102), and the etching of the boron oxide film 20 and the formation of the SAM 30 (step S103). In the first region A1, the formation of the SAM 30 and the etching of the boron oxide film 20 proceed at the same time, so that the formation of the SAM 30 can be suppressed.

The film formation method includes step S104 of etching and removing the boron oxide film 20 remaining in the first region A1 by supplying gas to the substrate 10 as shown in FIG. 2D after the formation of the SAM 30 (step S103) and before the formation of the conductive target film 40 (step S105). The gas used in step S104 is not particularly limited, and is, e.g., hydrogen fluoride (HF) gas. It is also possible to use chlorine trifluoride ($ClF_3$) gas, nitrogen trifluoride ($NF_3$) gas, or the like other than HF gas.

The SAM 30 has resistance to the gas used in step S104, and thus remains in the second region A2. On the other hand, in the first region A1, the density of the SAM 30 is low, so that the gas chemically reacts with the boron oxide film 20 while avoiding the SAM 30. Due to this chemical reaction, the boron oxide film 20 can be removed to expose the conductive film 11. By removing the boron oxide film 20, the SAM 30 on the boron oxide film 20 can also be removed, and the SAM 30 can remain only in the second region A2. In other words, the lift-off of the SAM 30 can be performed by removing the boron oxide film 20.

The film formation method includes step S105 of selectively forming the conductive target film 40 in the first region A1 from the first region A1 and the second region A2, using the SAM 30 formed in the second region A2 as shown in FIG. 3A, the first region having the conductive material exposed thereon. The target film 40 is made of a material, e.g., a metal, a metal compound, or a semiconductor, different from that of the SAM 30. Since the SAM 30 inhibits the formation of the conductive target film 40, the conductive target film 40 is selectively formed in the first region A1. When the third region exists in addition to the first region A1 and the second region A2, the conductive target film 40 may or may not be formed in the third region.

The conductive target film 40 is formed by, e.g., a chemical vapor deposition (CVD) method or an atomic layer deposition (ALD) method. The conductive target film 40 can be further laminated on the conductive film 11 originally existing in the first region A1. Although the material of the conductive target film 40 and the material of the conductive film 11 are the same material (e.g., W) in the present embodiment, they may be different materials. For example, the material of the conductive target film 40 may be molybdenum (Mo), titanium (Ti), titanium nitride (TiN), tantalum (Ta), tantalum nitride (TaN), vanadium (V), or vanadium nitride (VN) other than tungsten (W).

In the case of forming a tungsten film as the conductive target film 40 by the ALD method, a W-containing gas such as tungsten hexachloride ($WCl_6$) gas and a reducing gas such as hydrogen ($H_2$) gas are alternately supplied as the processing gases to the substrate 10. The processing gases may be heated to facilitate the chemical reaction. Further, these processing gases may be turned into plasma to facilitate the chemical reaction.

The film formation method includes step S106 of etching and removing the SAM 30 by supplying an oxygen-containing gas to the substrate 10 as shown in FIG. 3B after the formation of the conductive target film 40 (step S105). The oxygen-containing gas decomposes and gasifies the SAM 30. The gasified SAM 30 is removed, and the insulating film 12 is exposed in the second region A2.

The oxygen-containing gas for etching the SAM 30 is not particularly limited, and is, e.g., oxygen ($O_2$) gas, ozone ($O_3$) gas, water vapor, or the like. The oxygen-containing gas may be heated to a high temperature to facilitate the chemical reaction. Further, the oxygen-containing gas may be turned into plasma to facilitate the chemical reaction.

The film formation method includes step S107 of forming an insulating target film 50 in the first region A1 and the second region A2 as shown in FIG. 3C after the removal of the SAM 30 (step S106). The insulating target film 50 is formed by, e.g., a CVD method or an ALD method. The insulating target film 50 can be further laminated on the insulating film 12 originally existing in the second region A2.

Although the material of the insulating target film 50 and the material of the insulating film 12 are the same material (e.g., SiO) in the present embodiment, they may be different materials. For example, the material of the conductive film 11 may be silicon nitride, silicon oxynitride, silicon carbide, aluminum oxide, or the like, other than silicon oxide.

In the case of forming an SiO film as the insulating target film 50 by the ALD method, an Si-containing gas such as dichlorosilane ($SiH_2Cl_2$) gas and an oxidizing gas such as ozone ($O_3$) gas are alternately supplied as the processing gases to the substrate 10. In addition to the Si-containing gas and the oxidizing gas, a modifying gas such as hydrogen ($H_2$) gas may be supplied to the substrate 10. The processing gases may be turned into plasma to facilitate the chemical reaction. Further, the processing gases may be heated to facilitate the chemical reaction.

The film formation method includes step S108 of polishing the insulating target film 50 so that the conductive target film 40 is exposed in the first region A1, the insulating target film 50 is exposed in the second region A2, and the first region A1 and the second region A2 are planarized as shown in FIG. 3D. The polishing of the insulating target film 50 is, e.g., chemical mechanical polishing (CMP). By polishing the insulating target film 50, the conductive target film 40 can be exposed in the first region A1. Further, the first region A1 and the second region A2 can be planarized.

Figure 4:
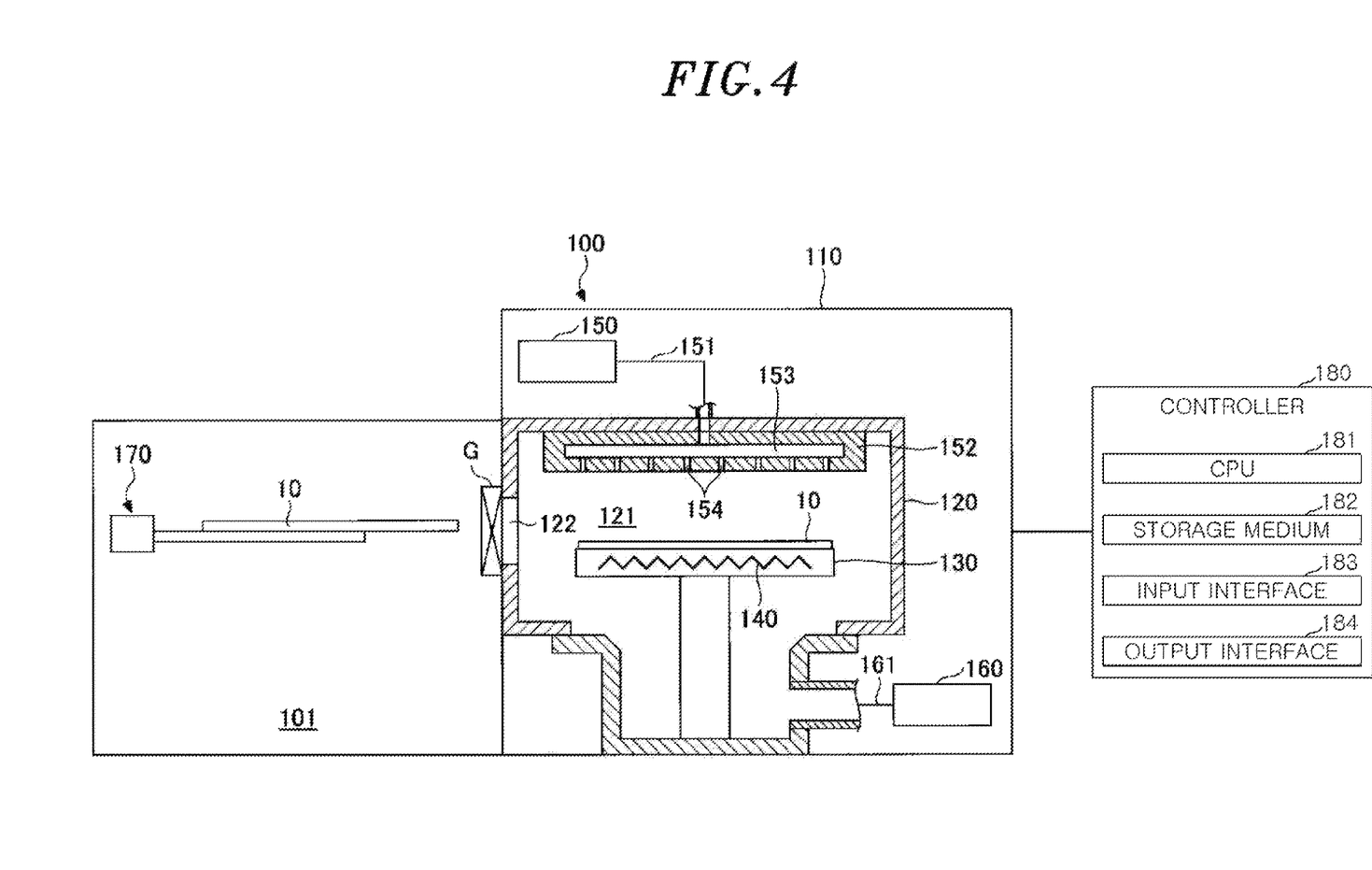
FIG. 4 is a cross-sectional view showing an example of a film formation device for executing steps S101 to S107 shown in FIG. 1.

FIG. 4 is a cross-sectional view showing an example of a film formation device for executing steps S101 to S107 shown in FIG. 1. A film formation device 100 may execute at least steps S101 to S103 and S105 among steps S101 to S108 shown in FIG. 1. Among the other steps S104 and S106 to S108, step S104 may not be executed as described above, and steps S106 to S108 may be executed by another device. The film formation device 100 includes a processing unit 110, a transfer unit 170, and a controller 180. The processing unit 110 includes the processing container 120, a substrate holder 130, a heater 140, a gas supplier 150, and a gas exhaust 160.

Although only one processing unit 110 is illustrated in FIG. 4, multiple processing units 110 may be provided. The multiple processing units 110 constitute a so-called multichamber system. The multiple processing units 110 are arranged to surround a vacuum transfer chamber 101. The vacuum transfer chamber 101 is exhausted by a vacuum pump and maintained at a preset degree of vacuum. In the vacuum transfer chamber 101, the transfer unit 170 is disposed to be movable in a vertical direction and a horizontal direction and rotatable about a vertical axis. The transfer unit 170 transfers substrates 10 to the multiple processing containers 120. A processing chamber 121 in the processing container 120 and the vacuum transfer chamber 101 communicate with each other when pressures therein are lower than an atmospheric pressure, and the substrate 10 is loaded and unloaded at that time. Unlike the case where an atmospheric transfer chamber is provided instead of the vacuum transfer chamber 101, it is possible to prevent air from flowing from the atmospheric transfer chamber into the processing chamber 121 during the loading/unloading of the substrate 10. Further, a standby time for lowering the pressure in the processing chamber 121 can be reduced, and a processing speed of the substrate 10 can be improved.

The processing container 120 has a loading/unloading port 122 through which the substrate 10 passes. The loading/unloading port 122 is provided with a gate G for opening/closing the loading/unloading port 122. The gate G basically closes the loading/unloading port 122, and opens the loading/unloading port 122 when the substrate 10 passes through the loading/unloading port 122. When the loading/unloading port 122 is opened, the processing chamber 121 in the processing container 120 and the vacuum transfer chamber 101 communicate with each other. Before the loading/unloading port 122 is opened, both the processing chamber 121 and the vacuum transfer chamber 101 are exhausted by the vacuum pump and maintained at a preset pressure.

The substrate holder 130 holds the substrate 10 in the processing container 120. The substrate holder 130 holds the substrate 10 horizontally from below so that the surface of the substrate 10 exposed to the processing gas faces upward. The substrate holder 130 is a single-wafer type and holds one substrate 10. The substrate holder 130 may be a batch type and hold multiple substrates 10 at the same time. The batch-type substrate holder 130 may hold multiple substrates 10 at intervals in the vertical direction or at intervals in the horizontal direction.

The heater 140 heats the substrate 10 held by the substrate holder 130. The heater 140 is, e.g., an electric heater, and generates heat by power supply. The heater 140 is embedded in the substrate holder 130, for example, and heats the substrate holder 130 to heat the substrate 10 to a desired temperature. The heater 140 may include a lamp that heats the substrate holder 130 through a quartz window. In this case, an inert gas such as argon gas or the like may be supplied to a gap between the substrate holder 130 and the quartz window to prevent the quartz window from becoming opaque due to deposits. Further, the heater 140 may beat the substrate 10 disposed in the processing container 120 from the outside of the processing container 120.

The processing unit 110 may further include a cooler for cooling the substrate 10 as well as the heater 140 for heating the substrate 10. Accordingly, a temperature of the substrate 10 can be raised and lowered at a high speed. On the other hand, when the processing of the substrate 10 is performed at room temperature, the processing unit 110 does not necessarily include the heater 140 and the cooler.

The gas supplier 150 supplies a preset processing gas to the substrate 10. The processing gas is prepared for each of steps S102 to S107, for example. Steps S102 to S107 may be executed in different processing containers 120, or two or more combinations of any steps may be executed continuously in the same processing container 120. In the latter case, the gas supplier 150 supplies multiple types of processing gases to the substrate 10 in a preset order based on the order of the steps.

The gas supplier 150 is connected to the processing container 120 through, e.g., a gas supply line 151. The gas supplier 150 includes processing gas supply sources, individual lines individually extending from each of the supply sources to the gas supply line 151, on-off valves disposed in the middle of the individual lines, and flow rate controllers disposed in the middle of the individual lines. When the on-off valves open the individual lines, the processing gases are supplied from the supply sources to the gas supply line 151. The supply amounts of the processing gases are controlled by the flow rate controllers. On the other hand, when the on-off valves close the individual lines, the supply of the processing gases from the supply sources to the gas supply line 151 is stopped.

The gas supply line 151 supplies the processing gas supplied from the gas supplier 150 into the processing container 120, e.g., into a shower head 152. The shower head 152 is disposed above the substrate holder 130. The shower head 152 has a space 153 therein, and discharges the processing gases stored in the space 153 vertically downward from multiple gas injection holes 154. The processing gas is supplied to the substrate 10 in a shower-like manner.

The gas exhaust 160 exhausts the gases from the inside of the processing container 120. The gas exhaust 160 is connected to the processing container 120 through a gas exhaust line 161. The gas exhaust 160 includes an exhaust source such as a vacuum pump or the like, and a pressure controller. When the exhaust source operates, the gases are exhausted from the processing container 120. The pressure in the processing container 120 is controlled by the pressure controller.

The controller 180 is, e.g., a computer, and includes a central processing unit (CPU) 181 and a storage medium 182 such as a memory or the like. The storage medium 182 stores programs for controlling various processes performed in the film formation device 100. The controller 180 controls the operation of the film formation device 100 by causing the CPU 181 to execute the programs stored in the storage medium 182. The controller 180 further includes an input interface 183 and an output interface 184. The controller 180 receives a signal from the outside through the input interface 183 and transmits the signal to the outside through the output interface 184.

The controller 180 controls the heater 140, the gas supplier 150, the gas exhaust 160, and the transfer unit 170 to execute steps S101 to S107 shown in FIG. 1. The controller 180 also controls the gate G.

Figure 5:
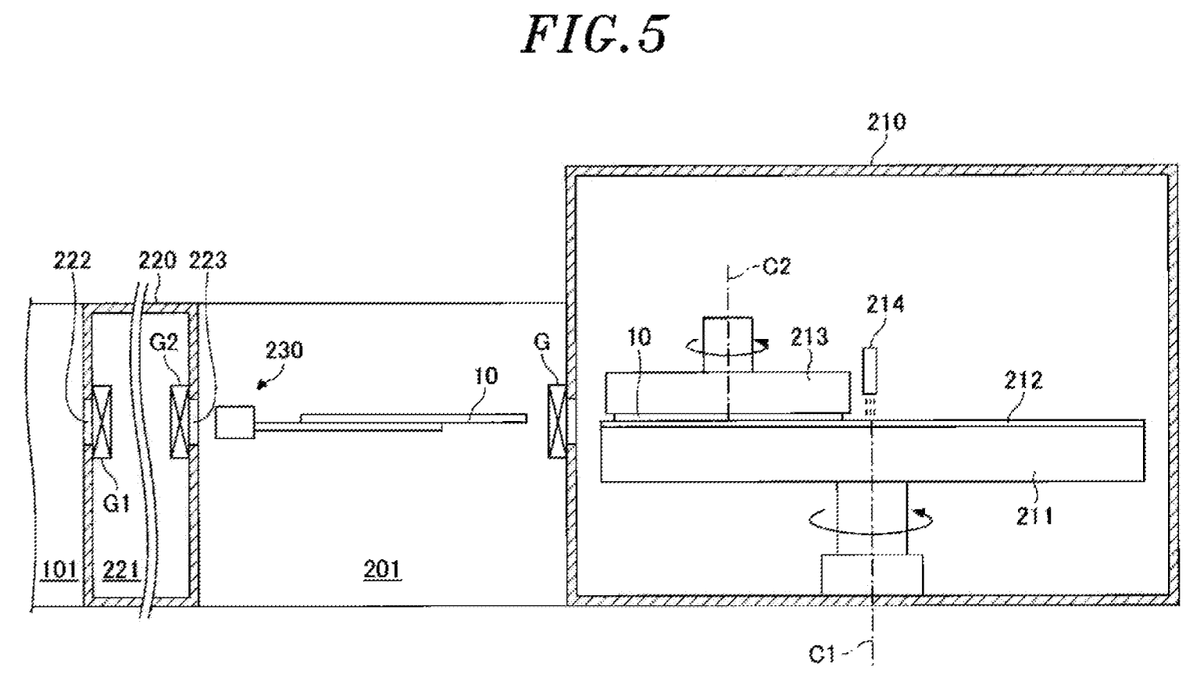
FIG. 5 is a cross-sectional view showing an example of a polishing device for executing step S108 shown in FIG. 1.

FIG. 5 is a cross-sectional view showing an example of a polishing device for executing step S108 shown in FIG. 1. The film formation device 100 further includes, e.g., a polishing device 210, a load-lock device 220, and a transfer unit 230. The load-lock device 220 forms a load-lock chamber 221 for switching a pressure in the middle of a transfer path for transferring the substrate 10 from the vacuum transfer chamber 101 to the atmosphere transfer chamber 201. The pressure in the load-lock chamber 221 is switched between a pressure lower than the atmospheric pressure and the atmospheric pressure. The load-lock device 220 has a first transfer port 222 and a second transfer port 223. The first transfer port 222 is formed between the vacuum transfer chamber 101 and the load-lock chamber 221 and is opened and closed by a gate G1. The second transfer port 223 is formed between the load-lock chamber 221 and the atmospheric transfer chamber 201, and is opened and closed by a gate G2. The atmospheric transfer chamber 201 is filled with air, and the transfer unit 230 is disposed in the atmospheric transfer chamber 201 to be movable in the vertical direction and the horizontal direction and rotatable about a vertical axis.

After the formation of the insulating target film 50 (step S107), the transfer unit 170 (see FIG. 4) transfers the substrate 10 from the vacuum transfer chamber 101 to the load-lock chamber 221. At this time, the first transfer port 222 is opened and the second transfer port 223 is closed, so that the pressure in the load-lock chamber 221 is maintained at the same level as that in the vacuum transfer chamber 101. Since gas inflow from the load-lock chamber 221 into the vacuum transfer chamber 101 can be prevented, it is possible to prevent variation of the pressure in the vacuum transfer chamber 101.

The transfer unit 170 loads the substrate 10 into the load-lock chamber 221 and retreats from the load-lock chamber 221 to the vacuum transfer chamber 101. Then, the first transfer port 222 is closed and the second transfer port 223 is opened, so that the pressure in the load-lock chamber 221 becomes the atmospheric pressure. Alternatively, after the first transfer port 222 is closed and before the second transfer port 223 is opened, a gas may be supplied to the load-lock chamber 221 so that the pressure in the load-lock chamber 221 becomes the atmospheric pressure. After the second transfer port 223 is opened, the transfer unit 230 receives the substrate 10 from the load-lock chamber 221 and transfers the substrate 10 to the polishing device 210.

The polishing device 210 has, e.g., a lower surface plate 211, an upper surface plate 213, and a nozzle 214. The lower surface plate 211 is disposed horizontally, and a polishing pad 212 is attached to the upper surface of the lower surface plate 211. The upper surface plate 213 is disposed horizontally, and the substrate 10 is fixed to the bottom surface of the upper surface plate 213. The upper surface plate 213 holds the substrate 10 horizontally and presses the insulating target film 50 against the polishing pad 212. A diameter of the upper surface plate 213 is smaller than a radius of the lower surface plate 211, and the upper surface plate 213 is disposed radially outside a rotation center line C1 of the lower surface plate 211. A rotation center line C2 of the upper surface plate 213 is horizontally spaced apart from the rotation center line C1 of the lower surface plate 211. The lower surface plate 211 may be rotated about the vertical rotation center line C1 thereof. The upper surface plate 213 passively rotates with the rotation of the lower surface plate 211. The upper surface plate 213 and the lower surface plate 211 may be rotated independently or may be rotated by separate rotary motors. The nozzle 214 supplies polishing slurry to the polishing pad 212 from above. The polishing slurry is supplied to a gap between the substrate 10 and the polishing pad 212 to planarize the bottom surface of the substrate 10.

The controller 180 (see FIG. 4) controls the polishing device 210 to execute step S108. The controller 180 also controls the transfer unit 230 and the load-lock device 220 as well as the polishing device 210.

While embodiments of the film formation method and the film formation device of the present disclosure have been described, the present disclosure is not limited to the above-described embodiments. Various changes, modifications, substitutions, additions, omissions, and combinations can be made without departing from the scope of the claims, and it is to be understood that these are also included in the technical scope of the present disclosure.

This application claims priority to Japanese Patent Application No. 2019-057164, filed on Mar. 25, 2019, the entire contents of which are incorporated herein by reference.

DESCRIPTION OF REFERENCE NUMERALS

10: substrate
11: conductive film
12: insulating film
14: base substrate
20: boron oxide film
30: self-assembled monolayer (SAM)
40: conductive target film
50: insulating target film
100: film formation device
110: processing unit
120: processing container
130: substrate holder
150: gas supplier
160: gas exhaust
170: transfer unit
180: controller
210: polishing device

The invention claimed is:

1. A film formation method comprising:
preparing a substrate having a first region on which an oxide formed by oxidization of a surface of a conductive material is exposed and a second region on which an insulating material is exposed;
replacing a film of the oxide with a film of boron oxide by supplying a boron halide gas to the substrate;
etching the boron oxide film in the first region and forming a self-assembled monolayer film in the second region by supplying a gas of a fluorine-containing silane compound to the substrate; and
forming a conductive target film selectively in the first region, from the first region and the second region, using the self-assembled monolayer film formed in the second region, the first region having the conductive material exposed thereon.

2. The film formation method of claim 1, wherein the conductive material is tungsten (W), molybdenum (Mo), titanium (Ti), titanium nitride (TiN), tantalum (Ta), tantalum nitride (TaN), vanadium (V), or vanadium nitride (VN).

3. The film formation method of claim 1, wherein the boron halide gas is boron trichloride ($BCl_3$), boron trifluoride ($BF_3$) gas, boron triiodide ($BI_3$) gas, or boron tribromide ($BBr_3$) gas.

4. The film formation method of claim 1, further comprising, after said forming the self-assembled monolayer film and before said forming the conductive target film, etching and removing the boron oxide film remaining in the first region by supplying a gas to the substrate.

5. The film formation method of claim 4, wherein the gas for etching the boron oxide film remaining in the first region is hydrogen fluoride (HF) gas.

6. The film formation method of claim 1, further comprising, after said forming the conductive target film, etching and removing the self-assembled monolayer film by supplying an oxygen-containing gas to the substrate.

7. The film formation method of claim 6, further comprising:
forming, after said removing the self-assembled monolayer film, an insulating target film in the first region and the second region; and
polishing the insulating target film so that the conductive target film is exposed in the first region, the insulating target film is exposed in the second region, and the first region and the second region are planarized.

* * * * *